United States Patent [19]
Chuang et al.

[11] Patent Number: 6,159,789
[45] Date of Patent: Dec. 12, 2000

[54] METHOD FOR FABRICATING CAPACITOR

[75] Inventors: Shu-Ya Chuang, Hsinchu Hsien; Anchor Chen, Pingtung, both of Taiwan

[73] Assignee: United Semiconductor Corp., Hsinchu, Taiwan

[21] Appl. No.: 09/306,093

[22] Filed: May 6, 1999

[30] Foreign Application Priority Data

Mar. 9, 1999 [TW] Taiwan ................................. 88103570

[51] Int. Cl.[7] .............................................. H01L 21/8242
[52] U.S. Cl. ............................................ 438/253; 438/244
[58] Field of Search .................................... 438/238–249, 438/253–256, 381, 386–392, 396–399

[56] References Cited

U.S. PATENT DOCUMENTS

| | | | |
|---|---|---|---|
| 5,900,659 | 5/1999 | Lee | 257/296 |
| 5,907,170 | 5/1999 | Forbes et al. | 257/296 |

*Primary Examiner*—Jey Tsai
*Attorney, Agent, or Firm*—Jiawi Huang; J.C. Patents

[57] ABSTRACT

A method for fabricating a capacitor in DRAM. A horizontal buried doped region is formed in a substrate. A pad oxide layer and a mask layer are formed in sequence on the substrate. A plurality of first trenches is formed in the substrate. Thus, a plurality of bit lines is formed in the substrate. A plurality of second trenches is formed in the substrate to expose the surface of the bit lines, wherein the second trenches cross the first trenches. Thus, a plurality of silicon islands on the bit lines is formed. A first insulation layer is formed in the first trenches and the second trenches, wherein the sidewall of the silicon islands are partly exposed and doped regions are formed in the exposed sidewall. A gate oxide layer is formed on the sidewall of the silicon islands. A spacer is formed on the gate oxide layer. A second insulation layer is formed over the substrate. The mask layer and the pad oxide layer are removed to expose the top surfaces of the silicon islands. A patterned conductive layer is formed over the substrate. A dielectric layer and an upper electrode are formed in sequence over the substrate.

19 Claims, 11 Drawing Sheets

METHOD FOR FABRICATING CAPACITOR

CROSS-REFERENCE TO RELATED APPLICATION

This application claims the priority benefit of Taiwan application serial no. 88103570, filed Mar. 9, 1999, the full disclosure of which is incorporated herein by reference.

BACKGROUND OF THE INVENTION

1. Field of the Invention

The present invention relates to a method of fabricating a semiconductor device. More particularly, the present invention relates to a method for fabricating a capacitor used in DRAM having a vertical gate.

2. Description of the Related Art

As long as the trend for forming highly integrated circuit continues, methods capable of forming devices having smaller dimensions must be developed. Right now, semiconductor devices having sub-micron line width are being manufactured. In the past, the means to increase the packing density of integrated circuit devices have included the reduction of structural dimensions. For a DRAM capacitor, that means a reduction of the surface area of its electrode. However, by so doing, the amount of electric charges that can be stored in the capacitor is greatly reduced.

In general, the amount of stored charges within a DRAM capacitor must be above a certain threshold level so that the stored data can be retrieved correctly. When some of the dimensions of a DRAM capacitor are reduced, the maximum amount of stored charges capable of being stored by the capacitor drops correspondingly. Furthermore, as the charge-storing capacity of the capacitor drops, frequency of refreshes necessary for compensating the lost charges due to current leakage must be increased. Constant refreshes compromise a data processing speed of the DRAM. Hence, a method to reduce the area occupation of a capacitor on a semiconductor substrate without decreasing its storage capacity is one major issue for design engineers.

Figure 1A:
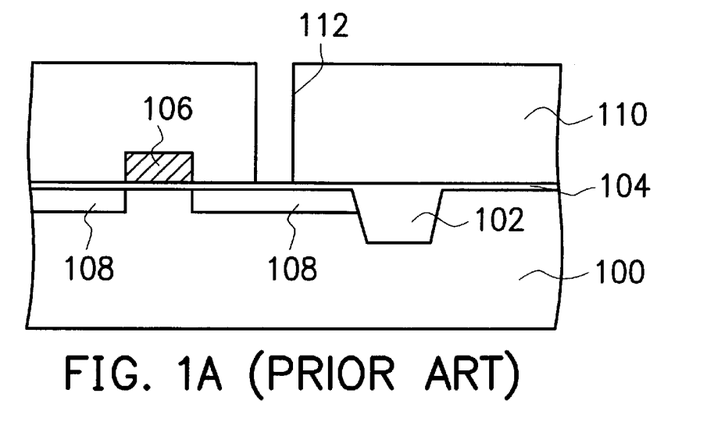
FIGS. 1A through 1C are schematic, cross-sectional diagrams used to depict steps in a conventional method for fabricating a capacitor.
Figure 1B:
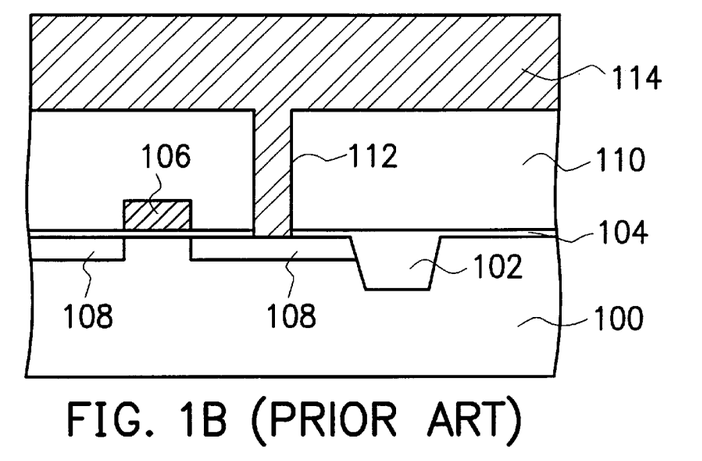
Figure 1C:
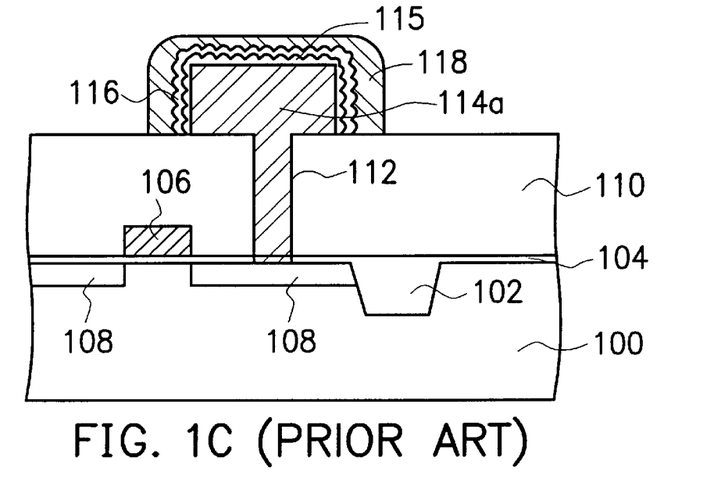

FIGS. 1A through 1C are schematic, cross-sectional diagrams used to depict steps in a conventional method for fabricating a capacitor.

Referring to FIG. 1A, a shallow trench isolation structure 102, a gate oxide layer 104 and a gate 106 are formed on a substrate 100. A source/drain region 108 is formed in the substrate 100. An oxide layer 110 is formed over the substrate 100. A contact opening 112 is formed in the oxide layer 110 to expose the source/drain region 108.

Referring to FIG. 1B, a conductive layer 114 is formed on the oxide layer 110 and fills the contact opening 112 to electrically couple with the source/drain region 108.

Referring to FIG. 1C, a photoresist layer (not shown) is formed on the conductive layer 114 to define a conductive region 114a. A hemispherical-grain silicon layer 115 is formed on the conductive region 114a. Thus a bottom electrode is formed. A dielectric layer 116 and a conductive layer 118 are formed in sequence on the hemispherical-grain silicon layer 115 to form a capacitor.

In the method mentioned above, the capacitor area shrinkage is limited by lithography limitation and alignment margin. Also, the bit line, the gate and the capacitor are all formed on the substrate, thus the area of each cell should be large enough for all necessary devices. Therefore, it is difficult to reduce the area of the cell. In other words, it is difficult to increase the integration of DRAM.

SUMMARY OF THE INVENTION

Accordingly, the present invention is to provide a method for fabricating a capacitor in DRAM having a vertical gate to enhance the integration thereof.

To achieve these and other advantages and in accordance with the object of the to present invention, as embodied and broadly described herein, this invention provides a method of fabricating a capacitor in DRAM having a vertical gate. The method for fabricating a capacitor includes the following steps. A horizontal buried doped region is formed in a substrate. A pad oxide layer and a mask layer are formed in sequence on the substrate. A plurality of first trenches is formed in the substrate. Thus, a plurality of bit lines is formed in the substrate. A plurality of second trenches is formed in the substrate to expose the surface of the bit lines, wherein the second trenches cross the first trenches. Thus, a plurality of silicon islands on the bit lines is formed. A first insulation layer is formed in the first trenches and the second trenches, wherein the sidewall of the silicon islands are partly exposed and doped regions are formed in the exposed sidewall. A gate oxide layer is formed on the sidewall of the silicon islands. A spacer is formed on the gate oxide layer. A second insulation layer is formed over the substrate. The mask layer and the pad oxide layer are removed to expose the top surfaces of the silicon islands. A patterned conductive layer is formed over the substrate. A dielectric layer and an upper electrode are formed in sequence over the substrate.

In the invention, the gates are fabricated vertically on the silicon islands. The limitation of lithography and alignment margin is reduced because only the silicon islands are formed on the substrate. So the silicon islands are fabricated closely. The integration of devices is increased.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DESCRIPTION OF THE PREFERRED EMBODIMENTS

Reference will now be made in detail to the present preferred embodiments of the invention, examples of which are illustrated in the accompanying drawings. Wherever possible, the same reference numbers are used in the drawings and the description to refer to the same or like parts.

Figure 2:
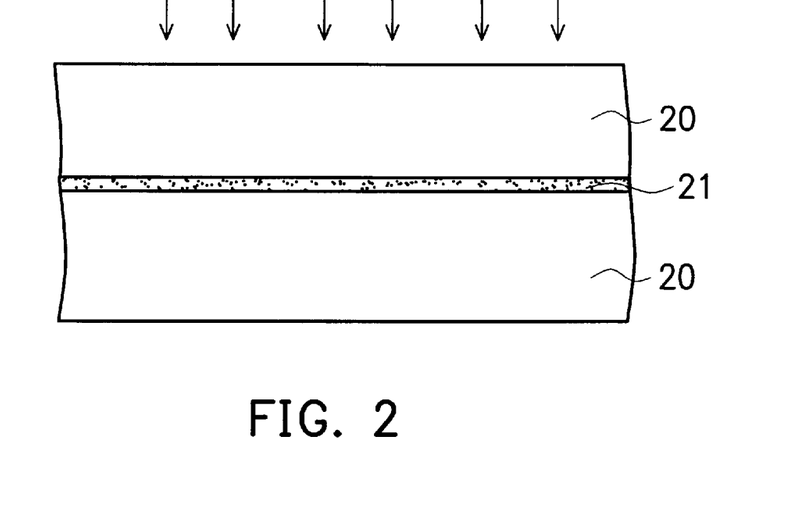
FIGS. 2, 3, 4, 5, 6, 7, 8, 9, 10, 11, 12, 13 are schematic, cross-sectional diagrams used to depict steps in a preferred embodiment of the method for fabricating a capacitor in accordance with the present invention.

Referring to FIG. 2, a horizontal, buried doped region 21 is formed in a substrate 20. The step for forming the buried doped region 21 in the substrate 20 includes implanting ions into a particular depth of the substrate 20, wherein the ions are selected according to a type of a subsequently formed MOS.

Figure 3:
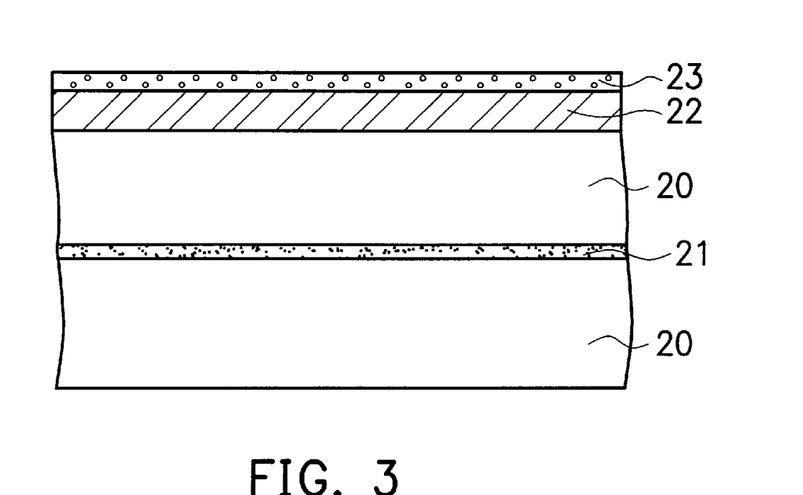

Referring to FIG. 3, a pad oxide layer 22 and a mask layer 23 are formed in sequence on the substrate 20 by, for example, chemical vapor deposition. The mask layer 23 is preferably silicon nitride.

Figure 4:
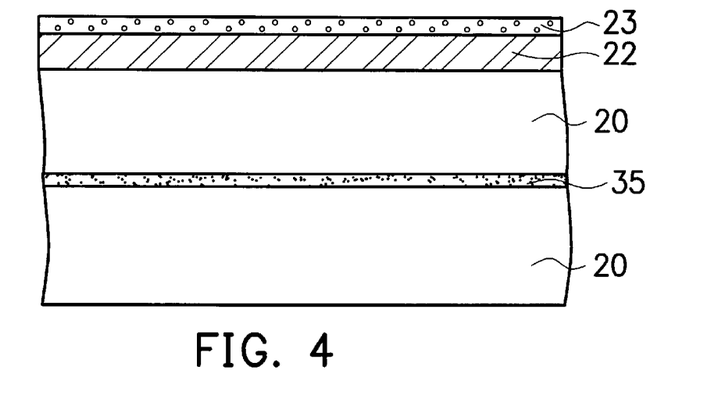
Figure 4A:
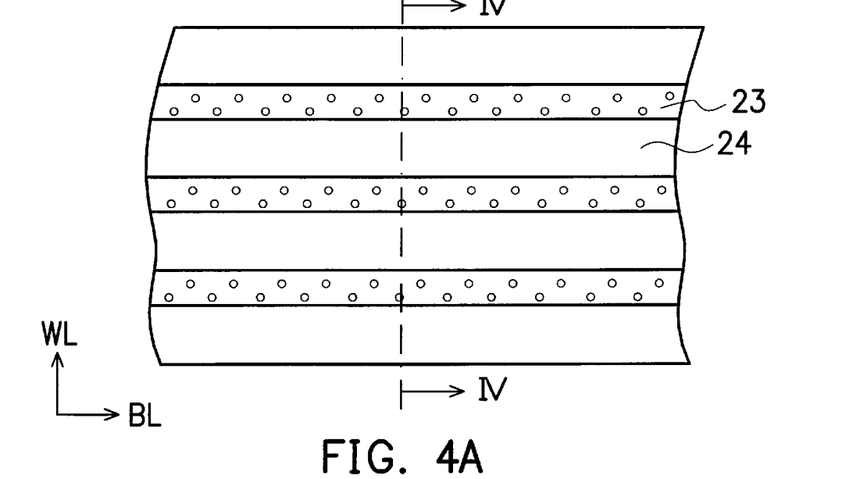
FIG. 4A is a schematic, top view of FIG. 4.
Figure 4B:
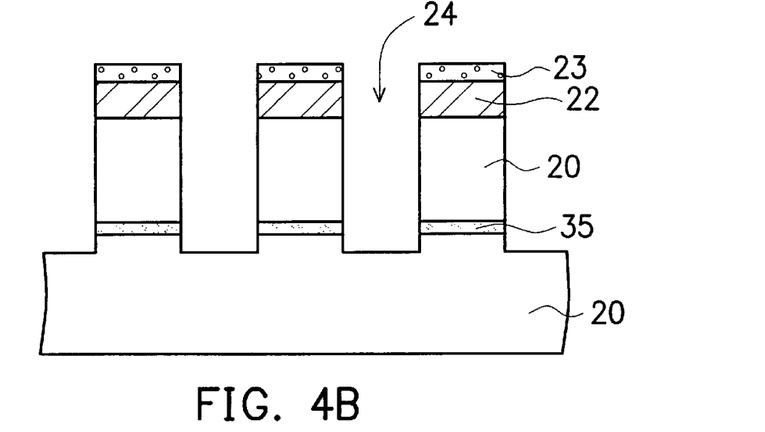
FIG. 4B is a schematic, cross-sectional view of FIG. 4 along a line IV—IV.

Referring to FIGS. 4, 4A and 4B, a plurality of trenches 24 is formed in the substrate 20 by, for example, anisotropic etching. Each interval between any two trenches 24 is the same. The depth of the trenches 24 is deeper than the buried doped region 21 (FIG. 2) as shown in FIG. 4B. The buried doped region 21 is divided, and a plurality of bit lines 35 buried in the substrate 20 is formed. A direction of the trenches 24 is called a bit line direction BL.

Figure 5:
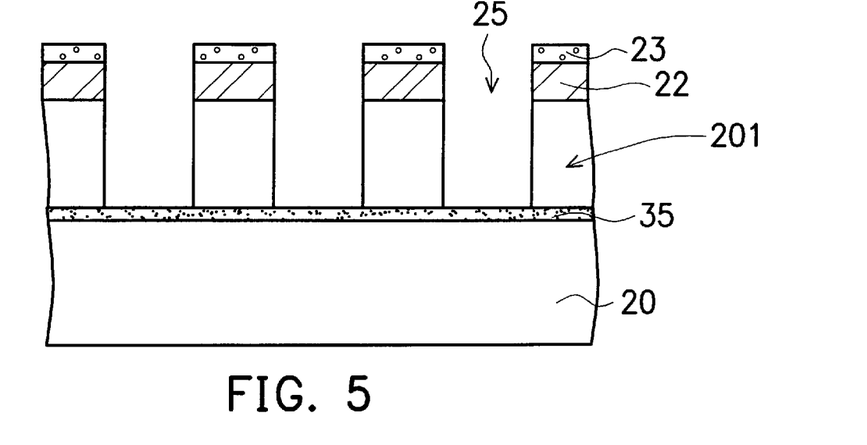
Figure 5A:
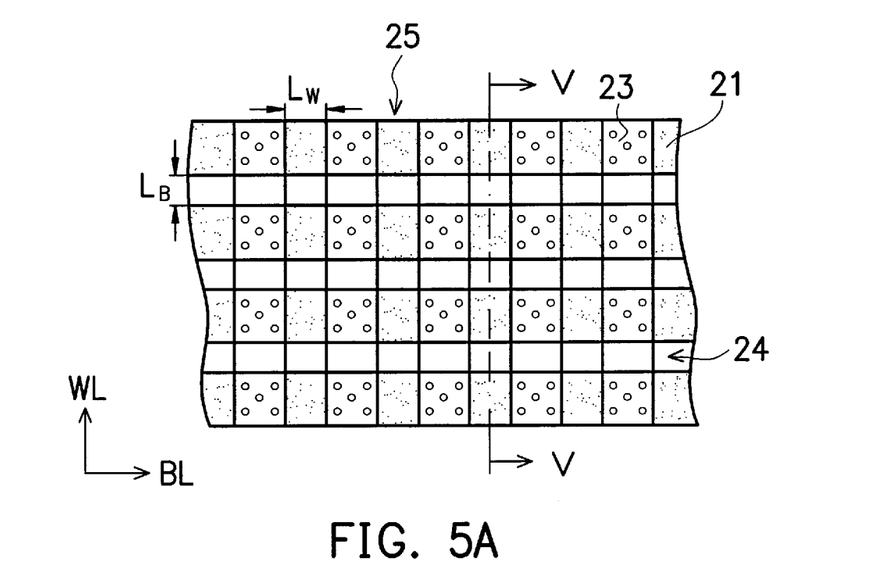
FIG. 5A is a schematic, top view of FIG. 5.
Figure 5B:
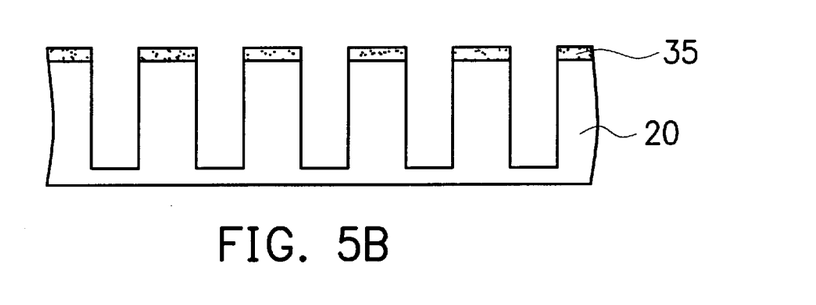
FIG. 5B is a schematic, cross-sectional view of FIG. 5 along a line V—V.

Referring to FIGS. 5, 5A and 5B, a plurality of trenches 25 is formed in the substrate 20 by, for example, anisotropic etching in a direction perpendicular to the bit line direction BL. This direction of the trenches 25 is called a word line direction WL. Each interval between any two trenches 25 is the same. Additionally, a width $L_B$ of the trenches 24 is smaller than a width $L_W$ of the trenches 25. The trenches 25 expose the surface of the bit lines 35 as shown in FIG. 5. Because the trenches 24 and the trenches 25 cross each other, the pad oxide layer 22 and the mask layer 23 are transformed like chess pieces on a chessboard (FIG. 5A). Furthermore, silicon islands 201 are formed on the substrate 20 shown in FIG. 5 and arranged like chess pieces on a chessboard shown in FIG. 5A. Because of formations of the trenches 24 and 25, intersections between the trenches 24 and 25 are deeper in FIG. 5B.

Figure 6:
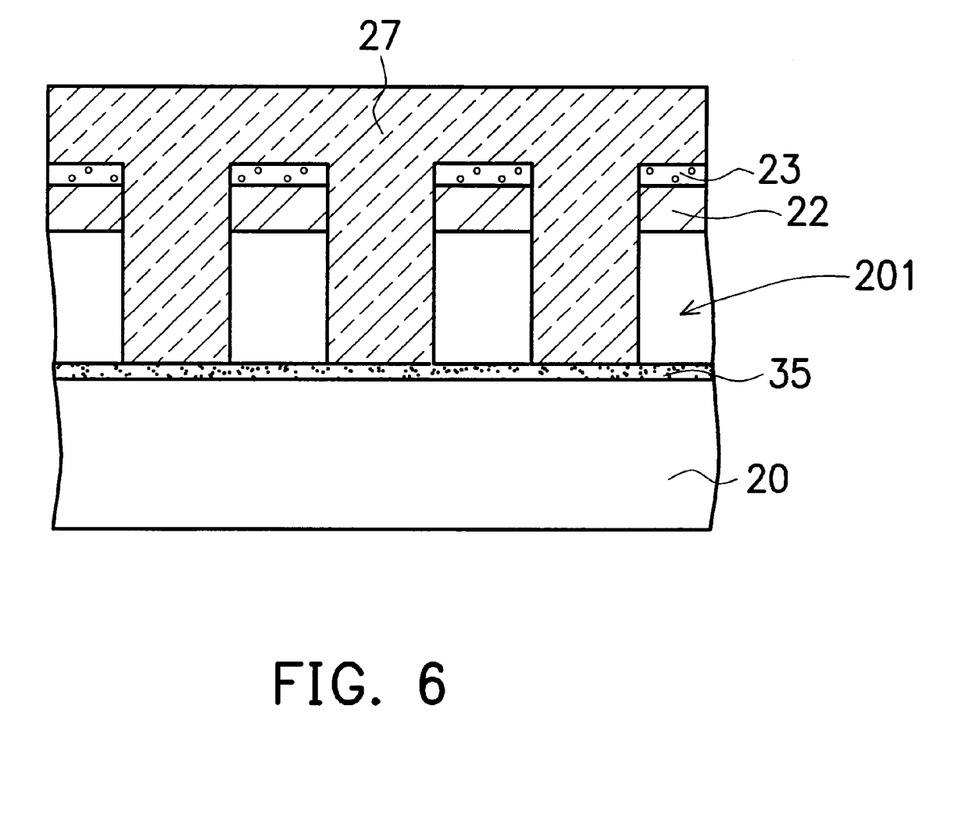

Referring to FIG. 6, an insulation layer 27 is formed over the substrate 20 and fills the trenches 24 and 25 by, for example, chemical vapor deposition. The insulation layer 27 is preferably silicon dioxide.

Figure 7:
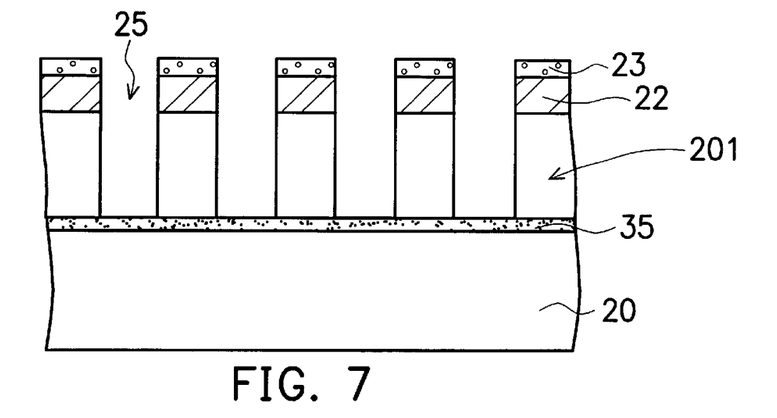
Figure 7A:
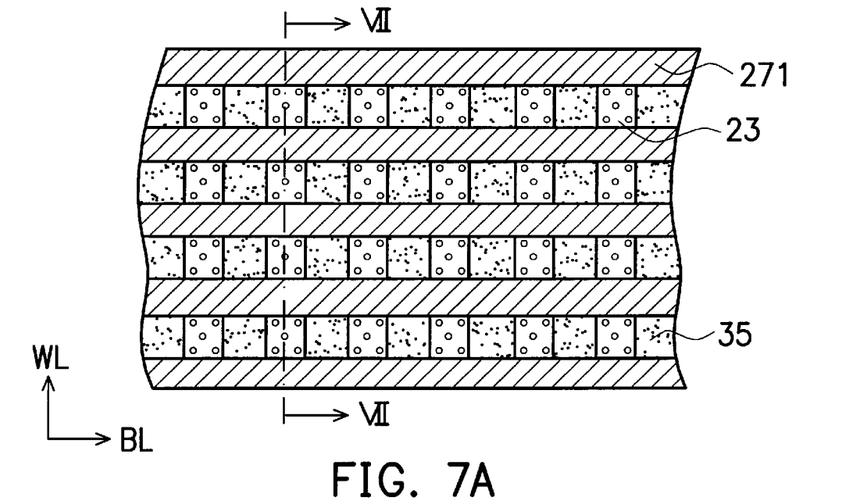
FIG. 7A is a schematic, top view of FIG. 7.
Figure 7B:
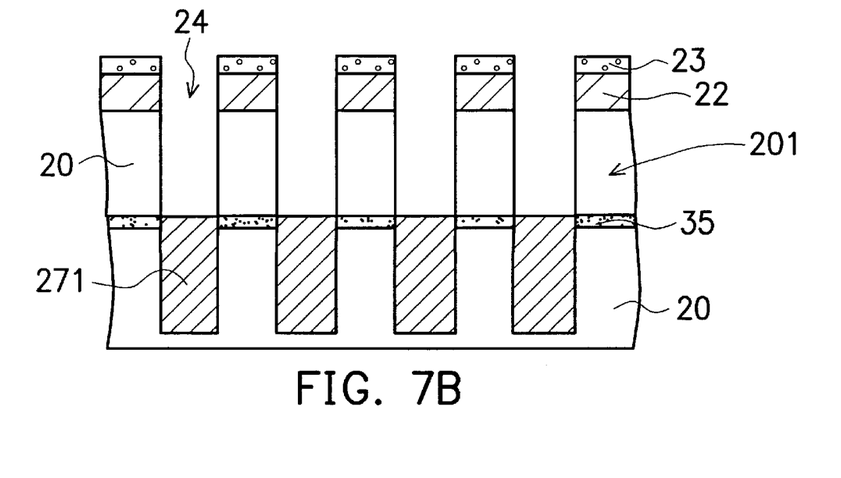
FIG. 7B is a schematic, cross-sectional view of FIG. 7 along a line VII—VII.

Now turning to FIGS. 7, 7A and 7B, an etch back process is performed to remove a portion of the insulation layer 27 by using the bit lines 35 as a stop layer. An insulation layer 271 is formed. Each of the bit lines 35 is isolated by the insulation layer 271.

Figure 8:
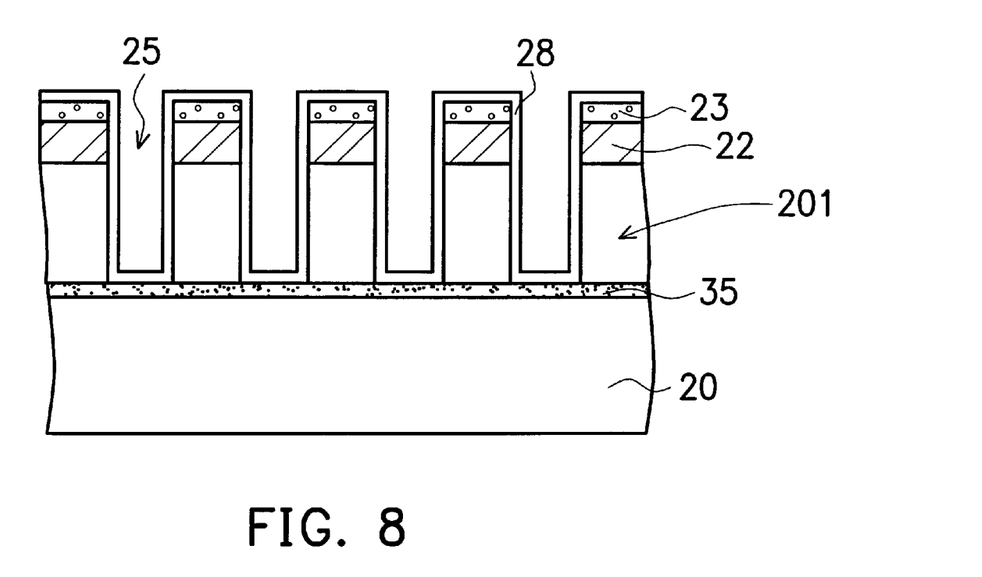

Referring to FIG. 8, a conformal dielectric layer 28 is formed over the substrate 20 for tuning threshold voltage. The dielectric layer 28 is for example phosphosilicate glass (PSG). A material formed the conformal dielectric layer 28 is selected according to the type of the subsequently formed MOS. Furthermore, a type of ions in the dielectric layer 28 is the same as the type of the doped region 21 (FIG. 2).

Figure 9:
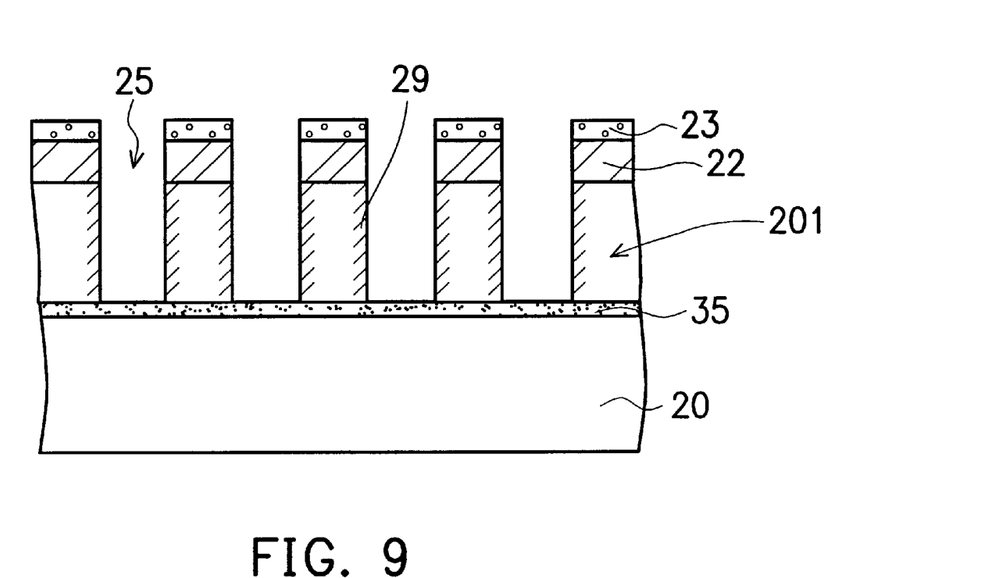

Then, an annealing process is performed. A doped region 29 is formed in the sidewall of the silicon islands 201 in FIG. 9. Ions doped is from the dielectric layer 28 and the type of the ions doped in the doped region 29 is the same as the type of the ions doped in the doped region 21 (shown in FIG. 2). The doped region 29 is formed because of the ion diffusion effect. The dielectric layer 28 is removed. The doped region 29 is not formed in the top surface of the silicon island 201 because of the mask layer 23 and the pad oxide layer 22.

Figure 10:
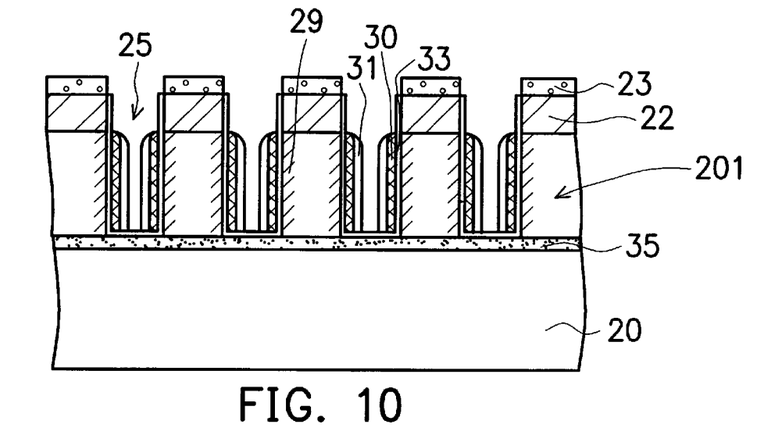
Figure 10A:
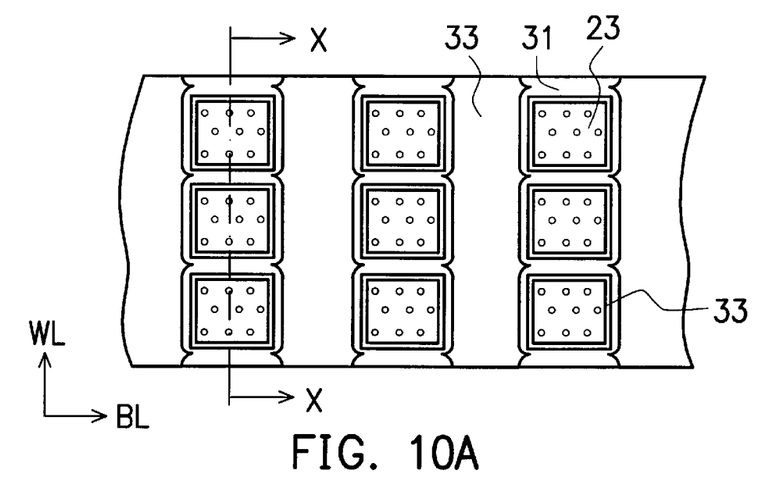
FIG. 10A is a schematic, top view of FIG. 10.
Figure 10B:
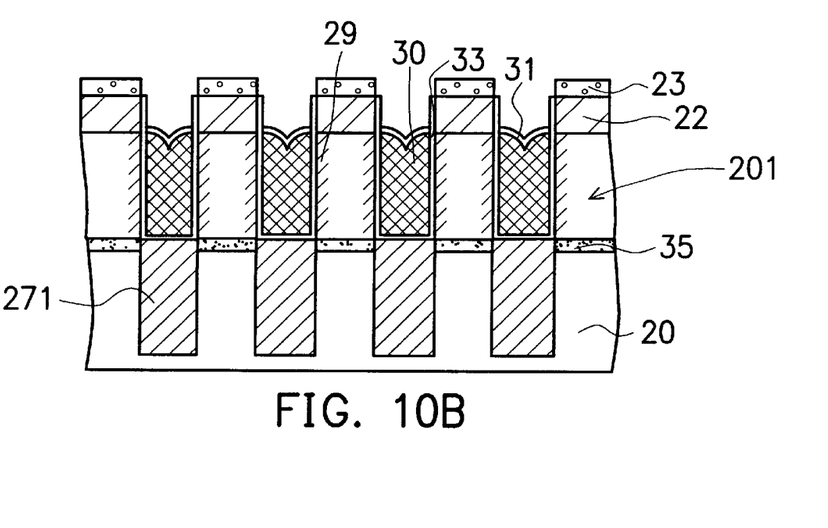
FIG. 10B is a schematic, cross-sectional view of FIG. 10 along a line X—X.

Referring to FIGS. 10 and 10B, a gate oxide layer 33 is formed on the sidewall of the silicon islands 201 and the sidewall of the pad oxide layer 22 by, for example, thermal oxidation. Then, a conductive layer (not shown) is formed over the substrate 20. The conductive layer is for example doped polysilicon. A spacer 30 is formed on the gate oxide layer 33 by removing a portion of the conductive layer. The process for removing the conductive layer is, for example, etching back.

As shown in FIGS. 10, 10A and 10B, the spacer 30 formed in the trenches 25 is separated because the width $L_W$ of the trench 25 is larger. However, the spacer 30 formed in the trench 24 is connected because the width $L_B$ of the trench 24 is smaller. Next, a silicide layer 31 is formed on the spacer 30. The formation of the silicide layer 31 includes the following steps. A metal layer (not shown) is formed over the substrate 20 and a thermal process is performed.

Figure 11:
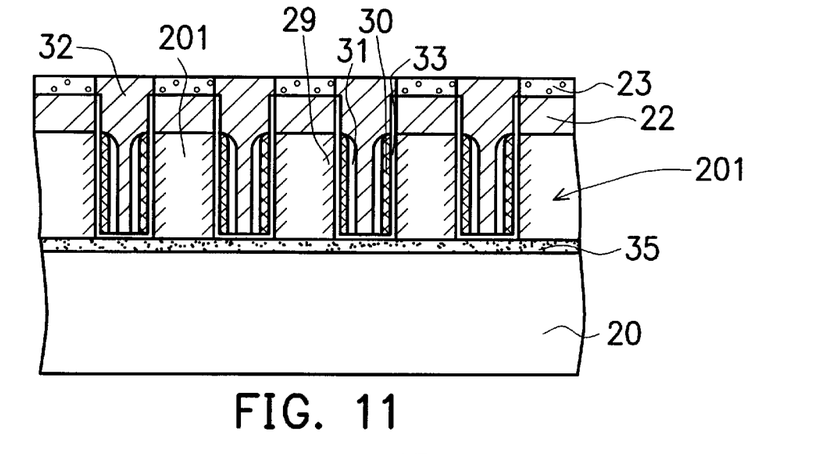
Figure 11A:
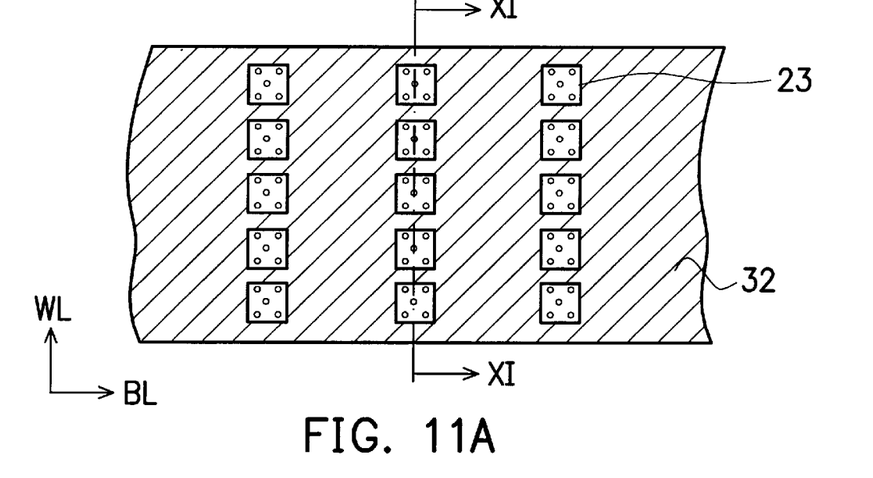
FIG. 11A is a schematic, top view of FIG. 11.
Figure 11B:
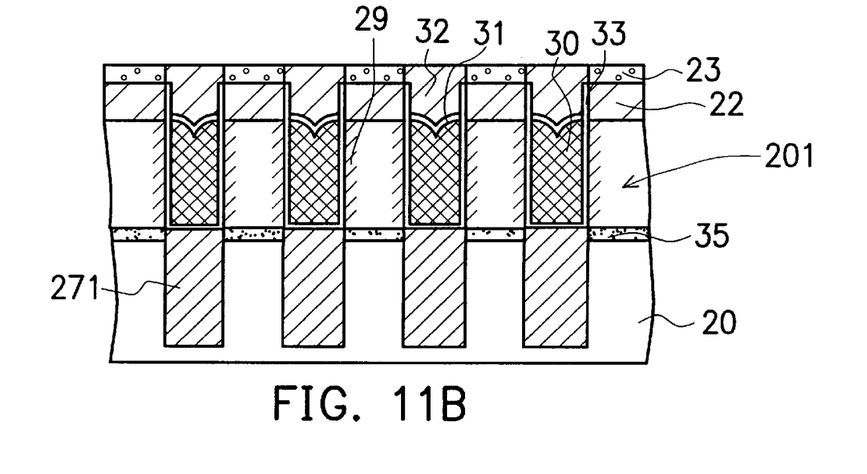
FIG. 11B is a schematic, cross-sectional view of FIG. 11 along a line XI—XI.

Referring to FIGS. 11, 11A and 11B, an insulation layer (not shown) is formed over the substrate 20. A portion of the insulation layer is removed by using the mask layer 23b as a stop layer, thus an insulation layer 32 is formed. The removal of the insulation layer is performed by, for example, chemical-mechanical polishing or etching back.

Figure 12:
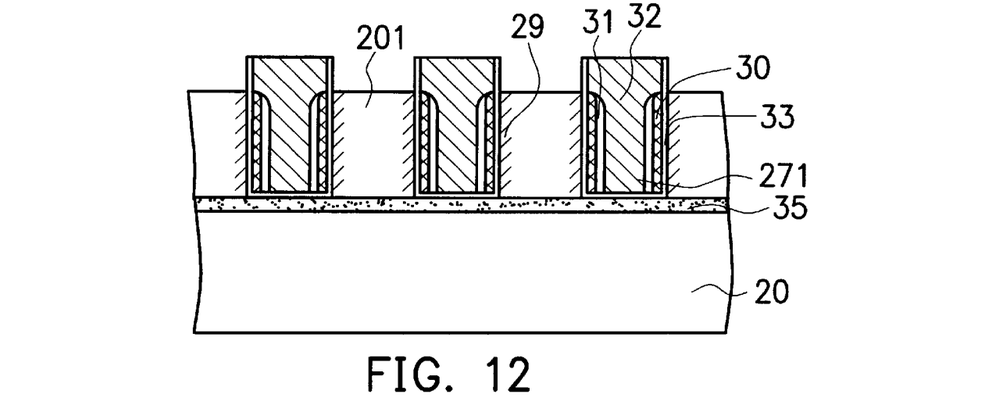
Figure 12A:
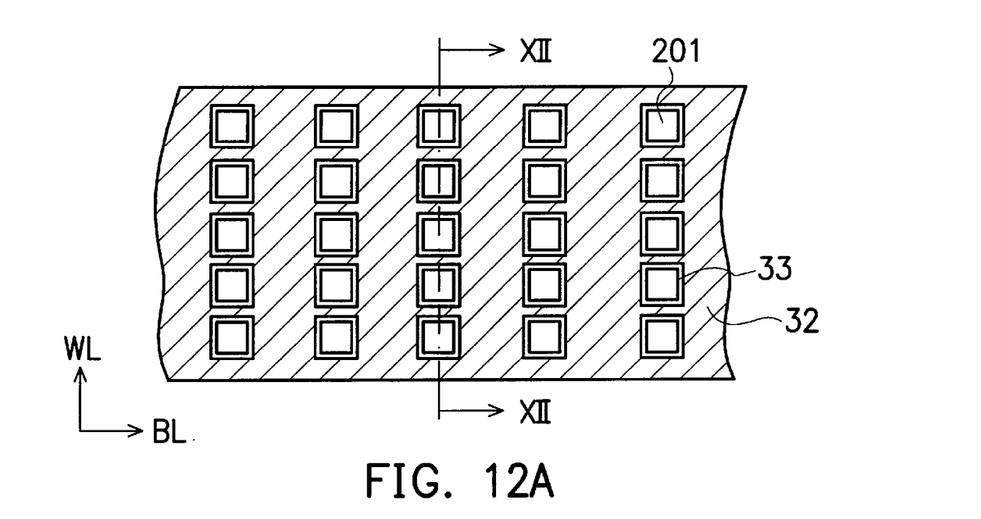
FIG. 12A is a schematic, top view of FIG. 12.
Figure 12B:
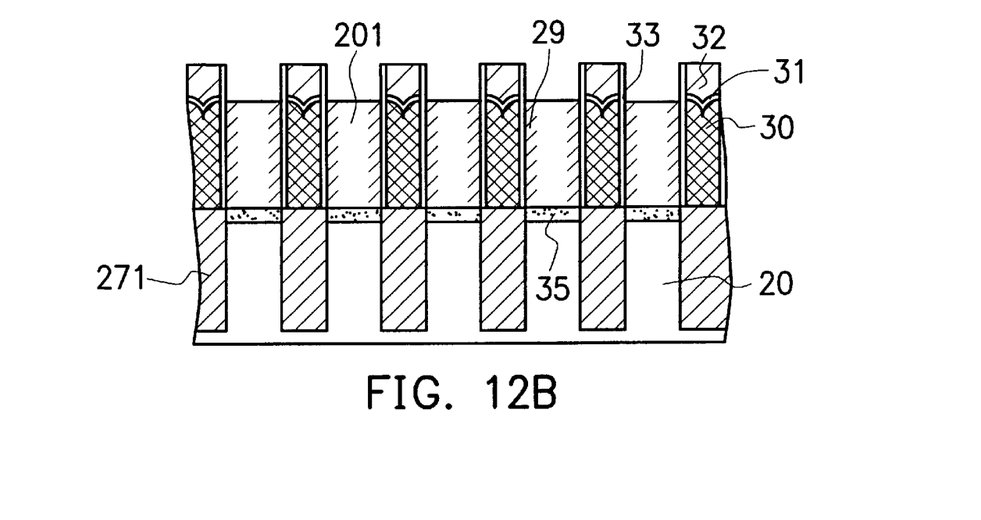
FIG. 12B is a schematic, cross-sectional view of FIG. 12 along a line XII—XII.

Referring to FIGS. 12, 12A and 12B, the mask layer 23 and the pad oxide layer 22 are sequentially removed by, for example, wet etching.

Figure 13:
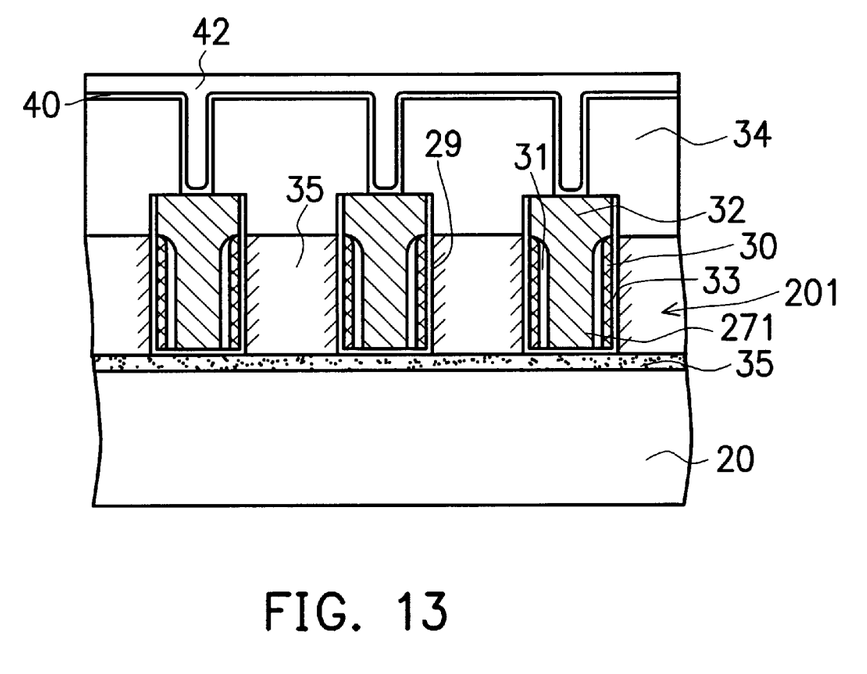

Referring to FIG. 13, a patterned conductive layer 34 is formed over the substrate 20, and the patterned conductive layer 34 is aligned with each silicon island 201. As a result, a bottom electrode is made from the patterned conductive layer 34. A dielectric layer 40 and an upper electrode 42 are formed in sequence over the substrate 20.

In accordance with the method of the present invention for fabricating a capacitor used in DRAM having a vertical gate, the gate is formed on the sidewall of the silicon island, so that the area of the capacitor is only the bottom area of the silicon island. The area of the capacitor is reduced. The integration of DRAM is increased. The limitations of lithography and alignment margins are overcome because the silicon islands, which are the bottom parts of the capacitors, are formed in a self-aligned process.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A method for fabricating a capacitor in DRAM, comprising the steps of:

forming a horizontal, buried doped region in a substrate;

forming a pad oxide layer and a mask layer in sequence on the substrate;

forming a plurality of first trenches to pass through the buried doped region, so that a plurality of bit lines is formed;

forming a plurality of second trenches, which cross the first trenches, to expose the surface of the buried doped region, so that a plurality of silicon islands are formed on the bit lines;

forming a first insulation layer within the first trenches and the second trenches, wherein a top surface of the first insulation layer is about equal to a top surface of the bit lines;

forming a gate oxide layer on the sidewall of the silicon islands;

forming a spacer on the gate oxide layer;

forming a second insulation layer over the substrate;

removing the pad oxide layer and the mask layer to expose the surfaces of the silicon islands;

forming a patterned conductive layer over the substrate;

forming a dielectric layer on the conductive layer; and forming an upper electrode on the dielectric layer.

2. The method of claim 1, a doped region is formed in the sidewall of the silicon islands after forming the first insulation layer.

3. The method of claim 2, wherein the step of forming the doped region comprises:

forming a conformal dielectric layer over the substrate; and performing an annealing process to form the doped region in the sidewall of the silicon islands.

4. The method of claim 3, wherein the dielectric layer includes phosphosilicate glass.

5. The method of claim 1, wherein the mask layer includes silicon nitride.

6. The method of claim 1, wherein the step of forming the mask layer includes chemical vapor deposition.

7. The method of claim 1, wherein the step of forming the first trenches and the second trenches includes anisotropic etching.

8. The method of claim 1, wherein the first trenches is narrower than the second trenches.

9. The method of claim 1, wherein the step of forming the first insulation layer comprises:

forming an insulation layer over the substrate to fill the first trenches and the second trenches; and removing a portion of the insulation layer to form the first insulation layer within the first trenches and the second trenches, wherein the sidewall of the silicon islands is exposed.

10. The method of claim 1, wherein the step of forming the gate oxide layer includes thermal oxidation.

11. The method of claim 1, wherein the step of forming the spacer on the gate oxide layer comprises:

forming a conductive layer over the substrate; and removing a portion of the polysilicon layer to form the spacer.

12. The method of claim 11, wherein the conductive layer includes polysilicon.

13. The method of claim 1, wherein the spacer formed in the second trenches is separated and the spacer formed in the first trenches 24 is connected.

14. The method of claim 1, a suicide layer is formed on the spacer after forming the spacer.

15. The method of claim 14, wherein the step of forming the suicide layer comprises:

forming a metal layer over the substrate; and performing a thermal process to form the silicide layer.

16. The method of claim 1, wherein the step of forming the second insulation layer comprises:

forming an insulation layer over the substrate; and removing a portion of the insulation layer to expose the mask layer, so that the second insulation layer is formed.

17. The method of claim 16, wherein the step of removing the insulation layer includes chemical-mechanical polishing.

18. The method of claim 16, wherein the step of removing the insulation layer includes etching back.

19. The method of claim 1, wherein the step of removing the pad oxide layer and the mask layer includes wet etching.

* * * * *